United States Patent [19]
Myers et al.

[11] Patent Number: 5,886,572
[45] Date of Patent: Mar. 23, 1999

[54] METHOD AND APPARATUS FOR REDUCING DISTORTION IN A POWER AMPLIFIER

[75] Inventors: Ronald Gene Myers, Scottsdale; Bernard Eugene Sigmon; Robert Michael Jackson, both of Gilbert, all of Ariz.

[73] Assignee: Motorola, Inc., Schaumburg, Ill.

[21] Appl. No.: 900,584

[22] Filed: Jul. 25, 1997

[51] Int. Cl.$^6$ .................................................... H03F 3/38
[52] U.S. Cl. ........................... 330/10; 330/136; 330/149
[58] Field of Search ........................... 330/10, 136, 149, 330/251, 207 A; 332/159–162

[56] References Cited

U.S. PATENT DOCUMENTS

| | | | |
|---|---|---|---|
| 4,210,874 | 7/1980 | Moskowitz | 330/136 |
| 4,831,334 | 5/1989 | Hudspeth et al. | 330/10 |
| 5,101,172 | 3/1992 | Ikeda et al. | 330/136 |
| 5,105,164 | 4/1992 | Fisher et al. | 330/149 |
| 5,115,205 | 5/1992 | Holmes, Jr. | 330/251 |
| 5,124,665 | 6/1992 | McGann | 330/149 |
| 5,138,274 | 8/1992 | Nakanishi et al. | 330/136 |
| 5,251,330 | 10/1993 | Chiba et al. | 455/91 |
| 5,610,553 | 3/1997 | Kirn | 330/10 |

FOREIGN PATENT DOCUMENTS

| | | | |
|---|---|---|---|
| 226456 | 9/1983 | United Kingdom | H04R 3/04 |

OTHER PUBLICATIONS

Publication entitled, "A High Efficiency 835 MHZ Linear Power Amplifier For Digital Cellular Telephony", M.J. Koch et al. Published by Gateway to New Concepts in Vehicular Technology, San Francisco May 1–3, 1989.

An article entitled "Single–Sideband Transmission By Envelope Elimination And Restoration" by Leonard R. Kahn from Proceeding of the I.R.E., 1952.

*Primary Examiner*—Robert Pascal
*Assistant Examiner*—Khanh Van Nguyen
*Attorney, Agent, or Firm*—Dana LeMoine

[57] ABSTRACT

A method and apparatus for efficient power amplification with low distortion includes an envelope detector (220), a difference amplifier (130), an envelope amplifier (270), and a power amplifier (260). A feedback path is provided from the output through a second envelope detector (120) to the difference amplifier (130). The feedback circuit operates on the bandwidth of the envelope of the RF signal rather than at the RF bandwidth. An envelope amplifier (270) includes a difference amplifier (272), a pulsewidth modulator (275), a driver (280), switching transistors (285), a low pass filter (290), and a voltage scaler (292). A feedback path within the envelope amplifier reduces the time delay introduced by low pass filter (290). The combined feedback loops work together to reduce distortion and lower intermodulation products.

11 Claims, 2 Drawing Sheets

METHOD AND APPARATUS FOR REDUCING DISTORTION IN A POWER AMPLIFIER

RELATED INVENTIONS

The present invention is related to an invention described in a co-pending patent application which is assigned to the same assignee as the present invention. The patent application describing the related invention is entitled "Method and Apparatus for Compensation of Phase Distortion in Power Amplifiers," Ser. No. 08/887,063, filed Jul. 2, 1997.

FIELD OF THE INVENTION

This invention relates in general to power amplifiers and, in particular, to high efficiency power amplifiers.

BACKGROUND OF THE INVENTION

Various apparatus are available for amplifying signals. In amplifier applications that involve the amplification and transmission of modulated signals, a premium is placed on amplifier efficiency. In addition, because many modulated signals contain information in the amplitude envelope and the phase of the signal, a premium is placed on the ability to create a high fidelity reproduction of the signal. In particular, the amplifier preferably exhibits very low amplitude distortion and very low phase distortion.

Communications devices, which often transmit signals having information in both amplitude and phase, are an example application where these qualities are in demand. Low distortion allows the communications devices to communicate more reliably and high efficiency allows the devices to operate longer on a single battery. PATENT One method of achieving increased efficiency is to use saturating amplifiers. Saturating amplifiers, such as class C amplifiers, achieve the goal of high efficiency at the expense of nonlinearity. Nonlinear amplifiers, however, cannot be used in applications where information is contained in the amplitude envelope because that information is corrupted by the nonlinear amplification. When amplitude information has been corrupted by a nonlinear amplifier, amplitude distortion has occurred.

In addition to distortion and loss of information, nonlinear operation of saturated amplifiers causes an increase in intermodulation products. Intermodulation products cause undesirable amounts of energy to be present in frequency bands other than the one intended for use. This undesirable energy is commonly quantified and termed Adjacent Channel Power (ACP). Excessively high levels of ACP can cause an amplifier to be unsuitable for a particular application.

Since efficiency has traditionally been gained by driving amplifiers into saturation, and since driving amplifiers into saturation causes intermodulation products to rise, high efficiency and low intermodulation products have historically been traded off against each other. It would be very desirable to achieve low intermodulation products in a highly efficient saturating amplifier, thereby obviating the need for a trade-off between the two.

Accordingly, a need exists for a high efficiency saturating amplifier with a linear amplitude response and resulting low amplitude distortion. A need also exists for a high efficiency saturating amplifier that exhibits low intermodulation products.

BRIEF DESCRIPTION OF THE DRAWINGS

The invention is pointed out with particularity in the appended claims. However, other features of the invention will become more apparent and the invention will be best understood by-referring to the following detailed description in conjunction with the accompanying drawings in which:

DETAILED DESCRIPTION OF THE DRAWINGS

Generally, the present invention helps solve the above-identified problems by providing a power amplifier circuit that amplifies the envelope of the input signal separately from the phase of the input signal, where the envelope of the output signal is provided as feedback into the circuit.

Figure 1:
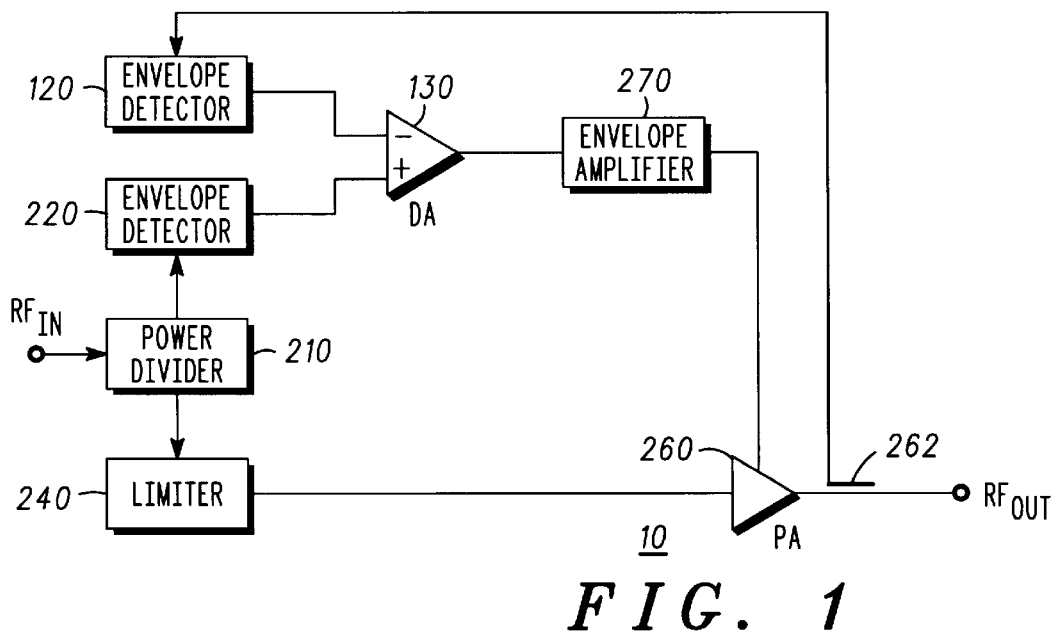
FIG. 1 a diagram of an amplifier circuit in accordance with a preferred embodiment of the present invention.

FIG. 1 shows a diagram of an amplifier circuit in accordance with a preferred embodiment of the present invention. Envelope elimination and restoration (EER)-type amplifiers such as the one shown in FIG. 1 are recognized as high efficiency amplifiers.

EER is a technique through which highly efficient but nonlinear radio frequency (RF) power amplifiers can be combined with other, highly efficient amplifiers to produce a high efficiency linear amplifier system. The detected envelope is amplified efficiently by a class S or other highly efficient power amplifier which only has to operate on the bandwidth of the RF envelope. Amplitude modulation of the final RF power amplifier restores the envelope to the phase modulated carrier creating an amplified replica of the input signal.

EER-type amplifier 10 includes power divider 210, envelope detector 220, difference amplifier 130, envelope amplifier 270, limiter 240, power amplifier 260, coupler 262, and envelope detector 120. EER-type amplifier 10 receives an RF input into power divider 210. Power divider 210 splits the RF input signal into an amplitude path which feeds envelope detector 220, and a phase path which feeds limiter 240.

The phase path of EER-type amplifier 10 includes limiter 240 and power amplifier 260. Limiter 240 receives the signal output from power divider 210 and amplitude limits the signal. Limiter 240 can be omitted, or can perform soft limiting, but limiter 240 preferably performs hard limiting so that the output of limiter 240 contains phase information with little or no amplitude information. The amplitude limited signal output from limiter 240 is input to power amplifier 260.

Noticeably missing from the preferred embodiment shown in FIG. 1, is the time delay element found in the phase path of most conventional EER-type amplifiers. The time delay element normally functions to balance the delay in the amplitude and phase paths. Because the preferred embodiment of the present invention provides other means to accomplish the delay matching, the time delay element may be advantageously omitted. This advantageous feature of the preferred embodiment is discussed further in connection with the amplitude path and the envelope amplifier below.

The amplitude path of EER-type amplifier 10 includes envelope detector 220, difference amplifier 130, and envelope amplifier 270. Envelope detector 220 detects the envelope of the RF input signal and outputs an envelope signal which represents the amplitude information contained in the original RF input signal. Envelope detector 220 is preferably a diode detector, however other types of detectors, such as a synchronous detector based upon a double balanced mixer, could be used.

Difference amplifier 130 receives the input envelope signal from envelope detector 220 and compares it to an output envelope signal generated by envelope detector 120. The output of difference amplifier 130 is a slightly distorted version of the input envelope signal. The distortion introduced is preferably equal and opposite any distortion introduced by power amplifier 260. To accomplish this distorting function, difference amplifier 130 may scale either the input envelope signal, the output envelope signal, or both before amplifying the difference. In cases where it is advantageous to have nonlinear scaling of the envelope signals or of the difference signal, it can be performed by difference amplifier 130. Difference amplifier 130 can be implemented in a variety of known ways, however it is preferably an operational amplifier.

Envelope detector 120 and envelope detector 220 are preferably matched so that they both introduce the same effects on the circuit. When both envelope detectors are matched, possible distortion introduced because of mismatch is reduced. Further, envelope detector 120 and envelope detector 220 are preferably located within the same package and are manufactured on the same substrate.

Coupler 262 is used to sample the output signal for the feedback. Of course, any means for sampling the output signal could be used in place of coupler 262 while still practicing the present invention. Coupler 262 takes a sample of the RF output waveform and feeds it back into the amplitude path through envelope detector 120. This feedback arrangement provides the well known benefits of feedback to an amplifier operating at very high frequency without the necessity of feeding back the very high frequency signals. The bandwidth requirements of the loop are dictated by the envelope bandwidth and not the RF bandwidth, so the benefits of the feedback can continue to be realized as the RF signals increase in frequency.

In practice, experimental results have shown that a significant improvement in intermodulation products can be achieved with the envelope feedback in the EER-type amplifier as shown in FIG. 1. The method and apparatus of the present invention as embodied in FIG. 1 sufficiently improves the intermodulation performance of the EER-type amplifier to allow full power, saturated operation and still meet strict adjacent channel power requirements that otherwise could not be met.

Envelope amplifier 270 amplifies the envelope signal output from difference amplifier 130 and drives the drain bias of power amplifier 260. Because envelope amplifier 270 only needs to operate on the bandwidth of the envelope rather than at the much higher RF bandwidth of the RF amplifier, envelope amplifier 270 can be an inexpensive and efficient amplifier with lower bandwidth requirements. One skilled in the art will recognize that there are many possible ways to implement envelope amplifier 270, but in a preferred embodiment, envelope amplifier 270 is a class S amplifier.

Envelope amplifier 270 amplifies the envelope signal to a level commensurate with the desired output. The output of the envelope amplifier is the power supply for RF power amplifier 260. The resultant remodulation of the phase modulated RF carrier restores the envelope, producing an amplified replica of the input signal.

Figure 2:
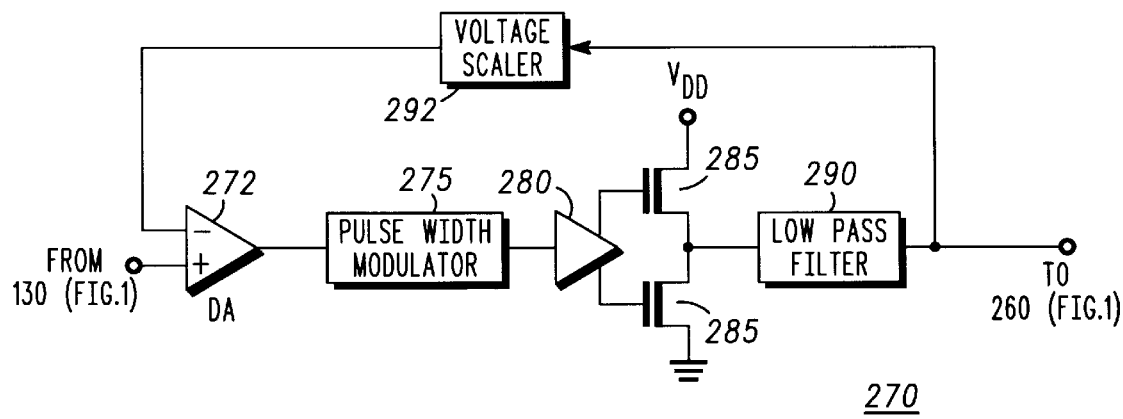
FIG. 2 shows a diagram of an envelope amplifier in accordance with a preferred embodiment of the present invention.

FIG. 2 shows a diagram of an envelope amplifier in accordance with a preferred embodiment of the present invention. Envelope amplifier 270 includes difference amplifier 272, pulsewidth modulator (PWM) 275, driver 280, switching transistors 285, low pass filter 290, and voltage scaler 292.

Difference amplifier 272 receives the input to envelope amplifier 270 and compares it to a scaled version of the output of envelope amplifier 270. The scaled version of the output of envelope amplifier 270 is produced by sampling the output of envelope amplifier 270 and scaling the resulting signal with voltage scaler 292. This signal path provides feedback within envelope amplifier 270. The sampling of the output is preferably a direct connection, however sampling means that introduce less circuit loading are also suitable.

Difference amplifier 272 may scale either or both of its input signals before amplifying the difference. In cases where it is advantageous to have nonlinear scaling of the envelope signals or of the difference signal, it can be performed by difference amplifier 272. In the preferred embodiment as shown in FIG. 2, voltage scaler 292 scales the sampled output and difference amplifier 272 does not scale either of its input signals. Difference amplifier 272 can be implemented in a variety of known ways, however it is preferably an operational amplifier.

PWM 275 performs pulsewidth modulation of the envelope signal output from difference amplifier 272 to produce a pulsewidth modulated signal which has a duty cycle proportional to the amplitude of the envelope signal. The pulsewidth modulated signal is then fed to driver 280. Switching transistors 285 and low pass filter 290, in response to driver 280, produce a signal that is an amplified version of the output of difference amplifier 272.

In this circuit arrangement, the output of difference amplifier 272 is input to PWM 275 rather than the envelope signal being directly input into PWM 275. The resulting feedback causes the output of envelope amplifier 270 to match very closely with the input of envelope amplifier 270, both in amplitude and phase. The output of low pass filter 290 is delayed relative to the input of PWM 275, but it is not delayed relative to the input of envelope amplifier 270 because of the effects of the feedback.

Conventional EER-type amplifiers exhibit a significant time delay in the envelope amplifier because of the delay introduced in the low pass filter following the pulsewidth modulator. In the preferred embodiment of the present invention as shown in FIG. 2, the effects of the delay introduced by low pass filter 290 have been removed by the feedback. The importance of the lack of delay in envelope amplifier 270 becomes apparent when viewing EER-type amplifier 10 as a whole.

As previously mentioned, conventional EER-type amplifiers include a delay element in the phase path to match the delay in the envelope amplifier low pass filter. Often this delay must be matched very closely and can therefore represent a significant expense. The removal of the delay in the amplitude path as in the preferred embodiment exemplified herein allows the removal of the delay in the phase path resulting in cost savings and decreased circuit complexity.

The combined circuit of FIG. 1 and FIG. 2 forms an EER-type amplifier with two feedback loops, one embedded within the other. The closed loop envelope amplifier shown in FIG. 2 forms the inner feedback loop. The outer feedback loop is formed by detection of the restored envelope at the output of the EER-type amplifier. The detected envelope at the output is compared to the RF input envelope using a difference amplifier to generate a new signal to drive the envelope amplifier. This new signal contains the distortion necessary to make the input and output envelopes nearly identical to reduce distortion in the amplification process.

Figure 3:
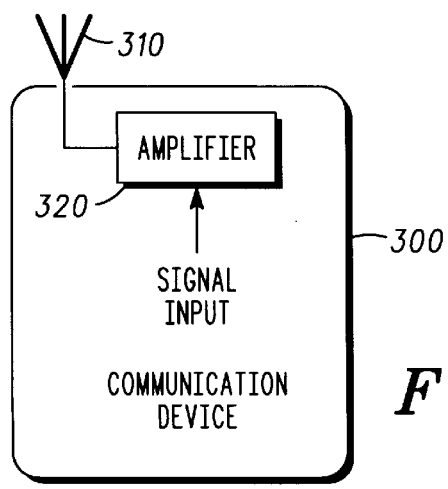
FIG. 3 shows a diagram of a communications device in accordance with an embodiment of the present invention.

FIG. 3 shows a diagram of a communications device in accordance with a preferred embodiment of the present invention. Communications device 300 includes power amplifier circuit 320 and antenna 310. Power amplifier circuit 320 may be any of the low distortion amplifiers of the present invention, including for example, EER-type amplifier 10 (FIG. 1). Communications device 300 may be one of many different devices capable of communications. Examples include, but are not limited to, individual subscriber units in a satellite communications system, amateur radios, business band radios, two way pagers, and cellular phones.

Figure 4:
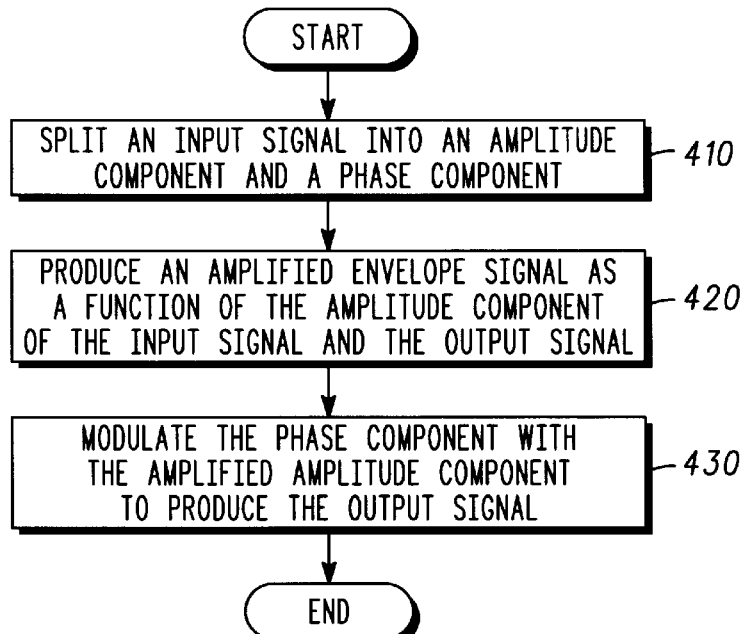
FIG. 4 shows a flow chart for a method of reducing distortion caused in a power amplifier in accordance with an embodiment of the present invention.

FIG. 4 shows a flowchart for a method of reducing distortion caused in a power amplifier in accordance with an embodiment of the present invention. Method 400 begins with step 410, in which an input signal is split into an amplitude component and a phase component. After step 410, the amplitude component and the phase component of the input signal can each be modified without affecting the other.

Next, in step 420, an amplified envelope signal is produced as a function of the amplitude component of the input signal and of the output signal. To accomplish this, an envelope detected version of the output signal is fed back into the amplitude path. The resulting amplified envelope signal contains information from the input envelope as well as the output envelope. Because the amplified envelope signal contains information from the output signal, the amplified envelope signal is predistorted in such a way as to decrease the effects of distortion caused in the amplifier chain following the amplified envelope signal. In a preferred embodiment, the amplified envelope signal is produced as a difference between the input envelope and the output envelope. This function is exemplified by difference amplifier 130 (FIG. 1).

After step 420, step 430 modulates the phase component with the amplified envelope signal to produce the output signal. This modulation can be performed by modulating the drain of a field effect transistor (FET) amplifier. In this way, the amplified envelope signal functions as the power supply of the final RF amplifier. As a result of the steps in method 400, the output signal is a more faithful reproduction of the input signal than could otherwise be obtained by conventional methods.

Figure 5:
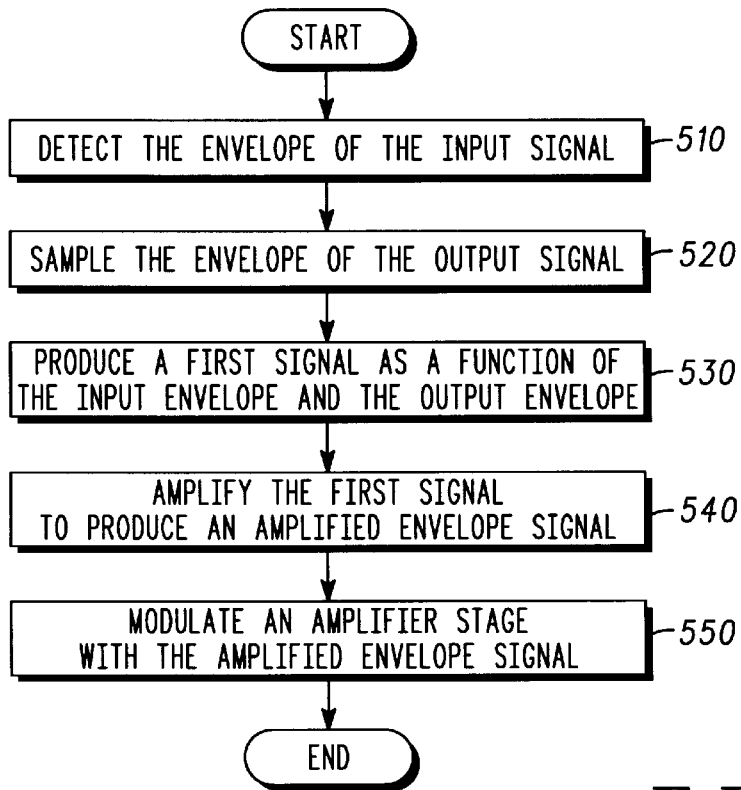
FIG. 5 shows a flow chart for a method of reducing distortion in an amplifier in accordance with a preferred embodiment of the present invention.

FIG. 5 shows a flowchart for a method of reducing distortion in an amplifier in accordance with a preferred embodiment of the present invention. In step 510 the envelope of the input signal is detected producing an input envelope signal. Then, in step 520, the envelope of the output signal is sampled producing an output envelope signal. After the input envelope signal is detected and the output envelope signal is sampled, a first signal is produced in step 530 as a function of the two envelope signals.

This first signal is analogous to an "error" signal in a conventional feedback system because it contains information from both the input and the output. In the preferred embodiment, the output envelope signal is scaled and then the first signal is produced by taking the difference between the input envelope signal and the scaled output envelope signal.

Then, in step 540, the first signal is amplified to produce an amplified envelope signal. An example of an amplifier that amplifies the first signal is shown as envelope amplifier 270 (FIG. 2). In step 540, where the first signal is amplified, the amplifier preferably contains a feedback loop. The output of the amplifier is fed back to the input of the amplifier after being scaled. The scaled output is then compared to the first signal, producing a second signal which is then amplified with a class S amplifier. The class S amplifier generates a pulsewidth modulated signal having a duty cycle proportional to the second signal, and then the pulsewidth modulated signal is low pass filtered to produce the amplified envelope signal.

Then in step 550 an amplifier stage is modulated with the amplified envelope signal. As a result of the steps in method 500, the output signal is a more faithful reproduction of the input signal than could otherwise be obtained by conventional methods.

In summary, the method and apparatus of the present invention provide a means for operating a saturating amplifier at full power with acceptably low intermodulation products. In addition, the method and apparatus of the present invention as described represent a versatile way of achieving low distortion in a high efficiency, linear power amplifier. Highly efficient linear amplifiers with low distortion are very useful in the amplification of modulated signals which contain information in both amplitude and phase. Communications devices, which often transmit signals having information in both amplitude and phase, benefit greatly from the apparatus and method of the present invention. Low distortion allows the communications devices to communicate more reliably and high efficiency allows the devices to operate longer on a single battery.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments. For example, coupler 262 and envelope detector 120 could be combined into a single function, or power amplifier 260 could be comprised of many amplifier stages.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method of reducing distortion caused in a power amplifier, said method comprising the steps of:

splitting an input signal into an amplitude path and a phase path;

modulating an amplifier stage in said phase path with an amplified envelope signal from said amplitude path;

envelope detecting an output of said power amplifier path to produce an output envelope signal;

envelope detecting a signal in said amplitude path to produce an input envelope signal;

amplifying a difference between said input envelope signal and said output envelope signal to produce a first difference signal;

amplifying a difference between said first difference signal and said amplified envelope signal to produce a second difference signal;

generating a pulsewidth modulated signal responsive to said second difference signal; and filtering said pulsewidth modulated signal to produce said amplified envelope signal.

2. A method of reducing distortion caused in a power amplifier, said method comprising the steps of:

splitting an input signal into an envelope signal and a phase signal;

modulating said phase signal with an amplified envelope signal to produce an output signal;

envelope detecting said output signal to produce an output envelope signal;

scaling said output envelope signal to produce a scaled output envelope signal;

amplifying an amplitude difference between said envelope signal and said scaled output envelope signal to produce a first difference signal;

generating a pulsewidth modulated signal having a duty cycle substantially proportional to an amplitude difference between said amplified envelope signal and said first difference signal; and filtering said pulsewidth modulated signal to produce said amplified envelope signal.

3. A method of reducing distortion in an amplifier, said method comprising the steps of:

detecting an envelope of a signal at an input of said amplifier to produce an input envelope signal;

sampling an envelope of a signal at an output of said amplifier to produce an output envelope signal;

producing a first signal as a function of said input envelope signal and said output envelope signal;

producing a second signal as a function of said first signal and an amplified envelope signal;

producing a pulsewidth modulated signal with a duty cycle substantially proportional to an amplitude of said second signal;

filtering said pulsewidth modulated signal to produce said amplified envelope signal; and modulating an amplifier stage with said amplified envelope signal.

4. The method of claim 3 further comprising the steps of:

amplitude limiting said signal at said input of said amplifier to produce an amplitude limited signal; and driving said amplifier stage with said amplitude limited signal.

5. An amplifier comprising:

a first envelope detector for detecting an envelope of an input signal to produce an input envelope signal;

a second envelope detector for detecting an envelope of an output signal to produce an output envelope signal;

a first difference amplifier responsive to said input envelope signal and to said output envelope signal for producing a first difference signal;

a second difference amplifier responsive to said first difference signal and to an amplified envelope signal, for producing a second difference signal;

a pulsewidth modulator responsive to said second difference signal for producing a pulsewidth modulated signal;

a filter responsive to said pulsewidth modulated signal for producing said amplified envelope signal; and a power amplifier which produces said output signal, wherein said power amplifier is modulated by said amplified envelope signal.

6. The amplifier of claim 5 wherein said pulsewidth modulated signal has a duty cycle substantially proportional to said second difference signal.

7. The amplifier of claim 5 wherein said first difference amplifier scales said output envelope signal before producing said first difference signal.

8. The amplifier of claim 5 wherein said first difference amplifier scales said input envelope signal before producing said first difference signal.

9. The amplifier of claim 5 wherein said first envelope detector and said second envelope detector are matched.

10. The amplifier of claim 5 wherein said first envelope detector and said second envelope detector are contained in a common package.

11. A communications device including an amplifier wherein said amplifier comprises:

a first envelope detector for detecting an envelope of an input signal to produce an input envelope signal;

a second envelope detector for detecting an envelope of an output signal to produce an output envelope signal;

a first difference amplifier responsive to said input envelope signal and to said output envelope signal for producing a first difference signal;

a second difference amplifier responsive to said first difference signal and to an amplified envelope signal, for producing a second difference signal;

a pulsewidth modulator responsive to said second difference signal for producing a pulsewidth modulated signal;

a filter responsive to said pulsewidth modulated signal for producing said amplified envelope signal; and a power amplifier which produces said output signal, wherein said power amplifier is modulated by said amplified envelope signal.

* * * * *